(12) United States Patent
Shen et al.

(10) Patent No.: US 7,221,000 B2
(45) Date of Patent: May 22, 2007

(54) REVERSE POLARIZATION LIGHT EMITTING REGION FOR A SEMICONDUCTOR LIGHT EMITTING DEVICE

(75) Inventors: Yu-Chen Shen, Sunnyvale, CA (US); Michael R. Krames, Mountain View, CA (US); Nathan F. Gardner, Sunnyvale, CA (US)

(73) Assignee: Philips Lumileds Lighting Company, LLC, San Jose, CA (US)

( * ) Notice: Subject to any disclaimer, the term of this patent is extended or adjusted under 35 U.S.C. 154(b) by 70 days.

(21) Appl. No.: 11/226,185

(22) Filed: Sep. 13, 2005

(65) Prior Publication Data

US 2006/0197100 A1 Sep. 7, 2006

Related U.S. Application Data

(63) Continuation of application No. 11/061,247, filed on Feb. 18, 2005, now abandoned.

(51) Int. Cl.
*H01L 29/22* (2006.01)
(52) U.S. Cl. .......................... 257/94; 257/103
(58) Field of Classification Search ................ 257/94, 257/461, 103, 96
See application file for complete search history.

(56) References Cited

U.S. PATENT DOCUMENTS

| | | | | |
|---|---|---|---|---|
| 5,625,202 A | * | 4/1997 | Chai | ............................ 257/94 |
| 5,874,747 A | * | 2/1999 | Redwing et al. | ............... 257/77 |
| 6,526,082 B1 | | 2/2003 | Corzine et al. | |
| 6,683,327 B2 | * | 1/2004 | Krames et al. | ................ 257/98 |
| 6,787,814 B2 | * | 9/2004 | Udagawa | ..................... 257/101 |
| 6,853,663 B2 | | 2/2005 | Hasnain et al. | |

OTHER PUBLICATIONS

Claudio R. Miskys et al., "MOCVD-epitaxy on free-standing HVPE-GaN substrates," paper, pp. 32-33.
P.R. Tavernier et al., "The growth of N-face GaN by MOCVD: effect of Mg, Si, and In," Journal of Crystal Growth 264 (2004), pp. 150-158.
M. Stutzmann et al., "Playing with Polarity,", phys. stat. sol. (b) 228, No. 2, (2001), pp. 505-512.
J.L. Weyher et al., "Morphological and structural characteristics of homepitaxial GaN grown by metalorganic chemical vapour deposition (MOCVD)," Journal of Crystal Growth, 204 (1999), pp. 419-428.
Kensaku Motoki et al., "Preparation of Large Freestanding GaN Substrates by Hydride Vapor Phase Epitaxy Using GaAs as a Starting Substrate," Jpn. J. Appl., Phys. vol. 40 (2001), Part 2, No. 2B, Feb. 15, 2001, pp. L140-L143.

(Continued)

*Primary Examiner*—Roy Potter
(74) *Attorney, Agent, or Firm*—Patent Law Group LLP; Rachel V. Leiterman (57) ABSTRACT

A semiconductor light emitting device includes a light emitting layer disposed between an n-type region and a p-type region. The light emitting layer may be a wurtzite III-nitride layer with a thickness of at least 50 angstroms. The light emitting layer may have a polarization reversed from a conventional wurtzite III-nitride layer, such that across an interface between the light emitting layer and the p-type region, the wurtzite c-axis points toward the light emitting layer. Such an orientation of the c-axis may create a negative sheet charge at an interface within or at the edge of the p-type region, providing a barrier to charge carriers in the light emitting layer.

24 Claims, 5 Drawing Sheets

OTHER PUBLICATIONS

Takashi Mukai et al., "Ultraviolet InGaN and GaN Single-Quantum-Well-Structure Light-Emitting Diodes Grown on Epitaxially Laterally Overgrown GaN Substrates," Jpn. J. Appl. Phys., vol. 38, (1999), Part 1, No. 10, Oct. 1999, pp. 5735-5739.

* cited by examiner

REVERSE POLARIZATION LIGHT EMITTING REGION FOR A SEMICONDUCTOR LIGHT EMITTING DEVICE

CROSS REFERENCE TO RELATED APPLICATIONS

This application is a continuation of application Ser. No. 11/061,247, filed Feb. 18, 2005 now abandoned.

BACKGROUND

1. Field of Invention

This invention relates to the light emitting region of a semiconductor light emitting device.

2. Description of Related Art

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III–V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, a light emitting or active region formed over the n-type layer or layers, and one or more p-type layers doped with, for example, Mg, formed over the active region. III-nitride devices formed on conductive substrates may have the p- and n-contacts formed on opposite sides of the device. Often, III-nitride devices are fabricated on insulating substrates, such as sapphire, with both contacts on the same side of the device. Such devices are mounted so light is extracted either through the contacts (known as an epitaxy-up device) or through a surface of the device opposite the contacts (known as a flip chip device).

Needed in the art are III-nitride light emitting devices that operate efficiently at high current density.

SUMMARY

In accordance with embodiments of the invention, a semiconductor light emitting device includes a light emitting layer disposed between an n-type region and a p-type region. The light emitting layer may be a wurtzite III-nitride layer with a thickness of at least 50 angstroms. The light emitting layer may have a polarization reversed from a conventional wurtzite III-nitride layer, such that across an interface between the light emitting layer and the p-type region, the wurtzite c-axis points toward the light emitting layer. Such an orientation of the c-axis may create a negative sheet charge at an interface within or at the edge the p-type region, providing a barrier to electrons in the conduction band in the light emitting layer. Such a thick, "reverse-polarization" light emitting layer may improve efficiency at high current density by providing a barrier to better trap charge carriers in the light emitting layer, and by providing a thicker light emitting layer which may reduce nonradiative recombination.

DETAILED DESCRIPTION

Figure 1:
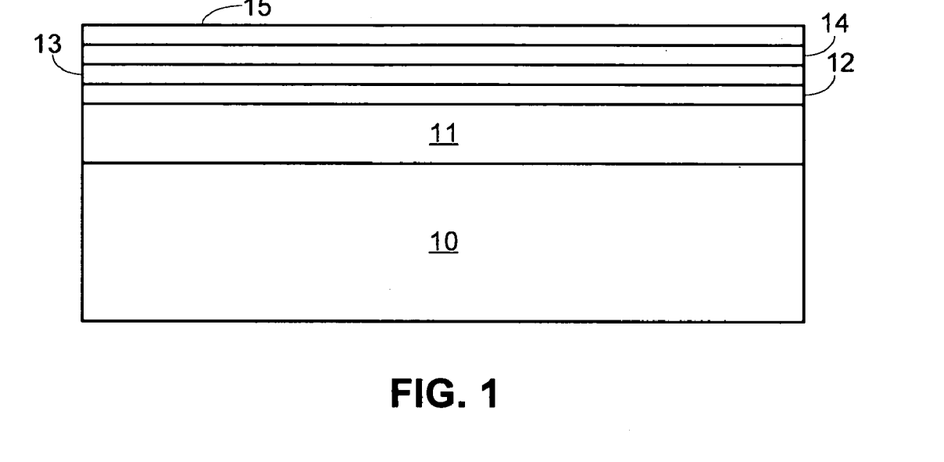
FIG. 1 illustrates a III-nitride light emitting device.

FIG. 1 illustrates a common III-nitride light emitting device. An n-type region 11 is grown over a sapphire substrate 10. An active region 12, which may include multiple quantum wells separated by barrier layers, is grown over n-type region 11, followed by a GaN spacer layer 13, a p-type AlGaN layer 14, and a p-type contact layer 15.

As the current density applied to the device of FIG. 1 increases, the internal quantum efficiency of the device, defined as the ratio of the flux of photons generated to the flux of carriers supplied, initially increases, then decreases. The design of the device of FIG. 1 may result in several possible causes for the decrease in internal quantum efficiency at high current density, including electron leakage from the active region and nonradiative recombination.

Figure 2:
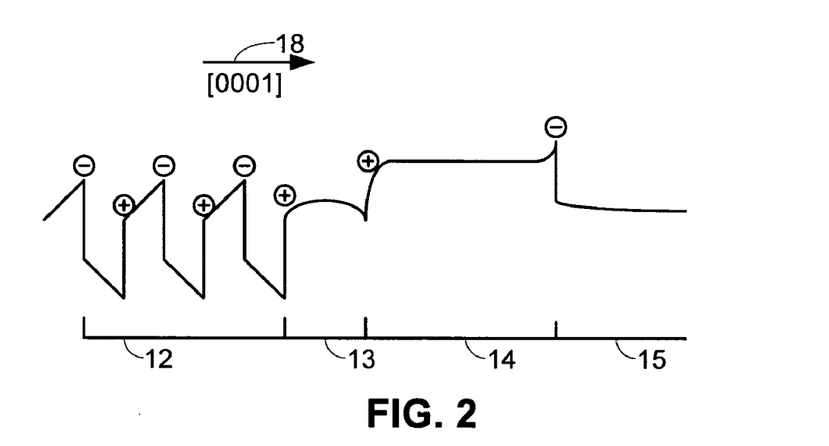
FIG. 2 illustrates a portion of the conduction band for the device of FIG. 1.

Electron leakage is exacerbated by naturally-occurring polarization in wurtzite crystals. The crystal layers in III-nitride devices grown on lattice-mismatched substrates such as sapphire are often grown as strained wurtzite crystals. Such crystals exhibit two types of polarization: spontaneous polarization, which arises from the crystal symmetry, and piezoelectric polarization, which arises from strain. The total polarization in a layer is the sum of the spontaneous and piezoelectric polarization. A polarization-induced sheet charge occurs at the interface between layers of different composition. In general, the density of a sheet charge will depend upon both the spontaneous polarization and the piezoelectric polarization due to strain between the two adjacent layers. FIG. 2 illustrates a portion of the conduction band of the device of FIG. 1. The sign and location of the sheet charges are indicated by "+" and "−" signs in FIG. 2.

Conventional growth on a typical substrate, such as sapphire or SiC, results in the wurtzite [0001] c-axis orientation indicated at 18 in FIG. 2. Across the interface between the active region and the p-type layers, the c-axis points toward the p-type layers. This orientation results in a positive sheet charge at the interface between GaN cap layer 13 and p-type AlGaN layer 14. In the device illustrated in FIG. 1, the interface between GaN cap layer 13 and p-type AlGaN layer 14 forms the energy "barrier" which confines electrons in the conduction band in the active region. It is to be understood that GaN cap layer 13 may be omitted, other materials may form the barrier, and that the problem with a positive sheet charge at the interface forming the barrier may be generalized to other devices. The positive sheet charge at the barrier reduces the effective energy barrier to electrons, permitting electrons to leak from the active region. Any leakage current recombines nonradiatively in the p-type layers and does not contribute to light emission from the device. As the current density increases, the amount of leakage current increases, contributing to the decrease in internal quantum efficiency at high current density.

In the III-nitride device illustrated in FIG. 1, the direction of current flow (i.e. the motion of positive charge carriers, or holes) is antiparallel to the direction of the c-axis. This relative arrangement of the current flow and polarization arises from the relative ease of growing Mg-doped p-type III-nitride material after the n-type region rather than before, and the conditions used for conventional growth of high quality III-nitride layers by MOCVD on sapphire substrates, which provide an excess of Ga compared to N present on the crystal surface, resulting in the positive direction of the [0001] c-axis pointing out of the surface of the film. Because the p-type region is placed on top of the n-type region, current will flow from the top of the wafer towards the substrate.

In order to provide high efficiency LEDs at high currents, in accordance with embodiments of the invention, the light emitting region of a semiconductor light emitting device is a reverse-polarization double heterostructure. "Reverse-polarization" refers to reversing the relative arrangement of current flow and c-axis from the device illustrated in FIG. 1, such that the current flow is parallel to the c-axis, not antiparallel as in the device of FIG. 1. Reversing the polarization in the light emitting region may reduce leakage current. Using a thick double heterostructure rather than a multiple quantum well active region may reduce the number of carriers lost to nonradiative recombination.

Figure 3:
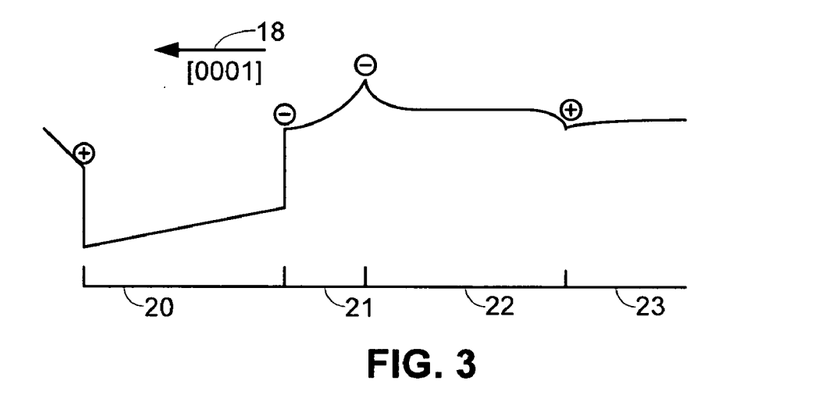
FIG. 3 illustrates a portion of the conduction band for a device according to embodiments of the invention.

FIG. 3 illustrates a portion of the conduction band of a device according to embodiments of the invention. In the device illustrated in FIG. 3, the barrier on the p-side of the light emitting layer, which confines charge carriers in light emitting layer 20, is disposed between cap layer 21, which may be GaN, and layer 22, which may be p-type AlGaN. Across the interface between the light emitting region and the p-type region, between layers 20 and 21, the c-axis points toward the light emitting region, as indicated at 18 in FIG. 3. In this orientation, the current flow is parallel to the c-axis. This orientation results in a negative sheet charge at the barrier, which increases the barrier height, reducing the electron current that leaks past light emitting region 20. In some embodiments, cap layer 21 may be doped n-type or not intentionally doped. Since cap layer 21 is located on the p-side of the light emitting layer cap layer 21 is considered part of the p-type region of the device, even if cap layer 21 is n-type or undoped.

In the device illustrated in FIG. 3, the multiple quantum wells of FIG. 2 are replaced by a single, thick light emitting layer 20. In some embodiments, light emitting layer 20 may have a thickness between, for example, 50 and 500 Å, more preferably has a thickness between 60 and 300 Å and more preferably has a thickness between 75 and 175 Å. The optimal thickness may depend on the dislocation density within the light emitting layer. In general, as the dislocation density increases, the optimal thickness of the light emitting layer decreases. The dislocation density in the active region is preferably limited to less than $10^9/cm^2$, more preferably limited to less than $10^8/cm^2$, more preferably limited to less than $10^7/cm^2$, and more preferably limited to less than $10^6/cm^2$. Achieving the above-described dislocation densities may require growth techniques such as epitaxial lateral overgrowth, hydride vapor phase epitaxy, and growth on freestanding GaN substrates. Epitaxial lateral overgrowth involves selective growth of GaN over openings in a mask layer formed on GaN layer grown on a conventional growth substrate such as sapphire. The coalescence of the selectively-grown GaN may enable the growth of a flat GaN surface over the entire growth substrate. Layers grown subsequent to the selectively-grown GaN layer may exhibit low dislocation densities. Epitaxial lateral overgrowth is described in more detail in Mukai et al., "Ultraviolet InGaN and GaN Single-Quantum Well-Structure Light-Emitting Diodes Grown on Epitaxial Laterally Overgrown GaN Substrates," Jpn. J. Appl. Phys. Vol. 38 (1999) p. 5735, which is incorporated herein by reference. Hydride vapor phase epitaxial growth of freestanding GaN substrates is described in more detail in Motoki et al., "Preparation of Large Freestanding GaN Substrates by Hydride Vapor Phase Epitaxy Using GaAs as a Starting Substrate," Jpn. J. Appl. Phys. Vol. 40 (2001) p. L140, which is incorporated herein by reference.

Several methods can be employed to produce a device where the direction of current flow is parallel to the direction of the c-axis. The first method is to reverse the direction of the [0001] c-axis during growth, without affecting the direction of the current flow. The second method is to reverse the order of the p- and n-type layers, which reverses the direction of current flow without affecting the direction of the c-axis.

Figure 4:
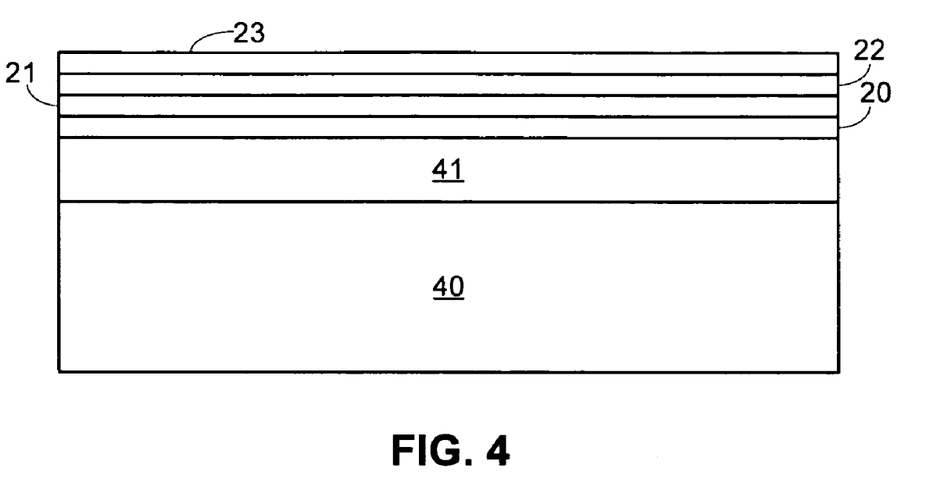
FIG. 4 illustrates an example of a device having the conduction band illustrated in FIG. 3.
Figure 9:
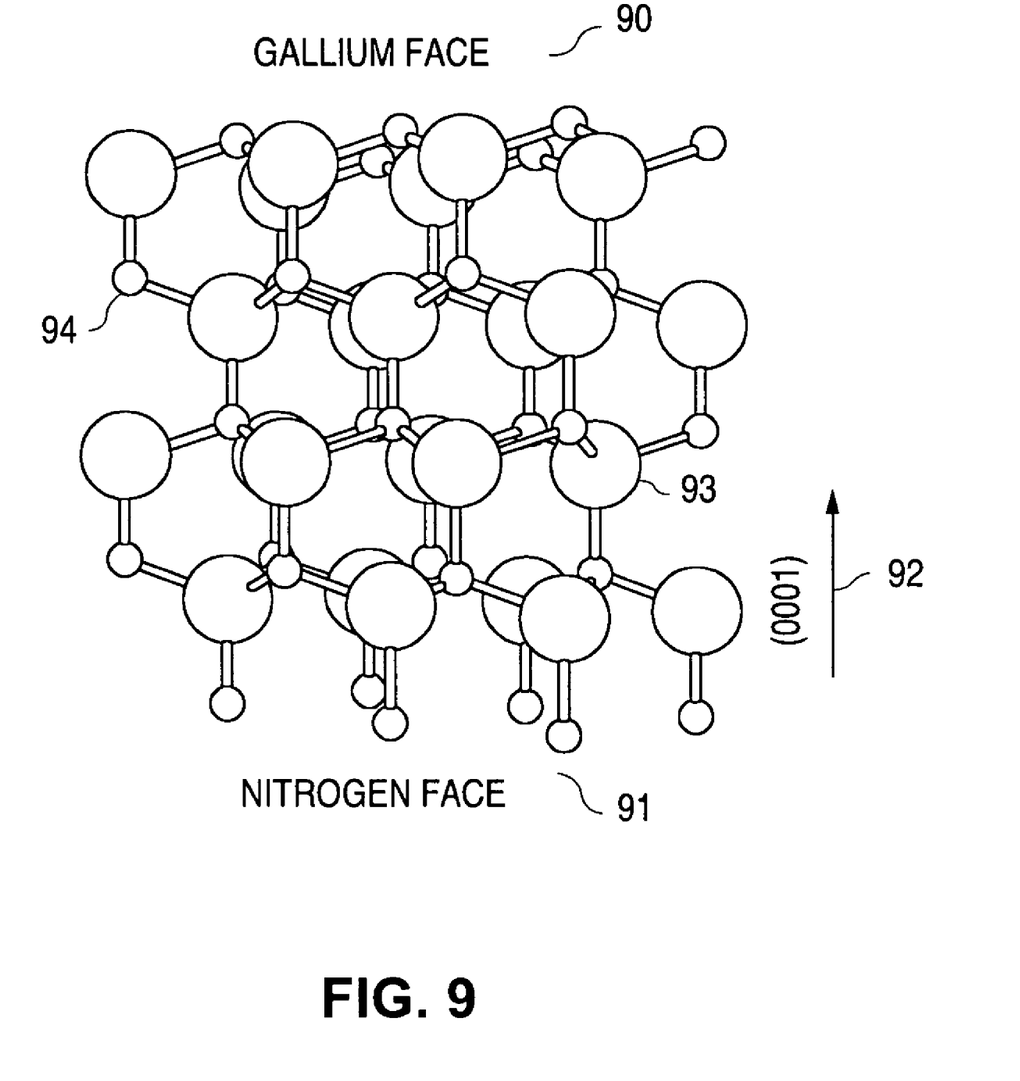
FIG. 9 illustrates a unit cell of wurtzite GaN.

FIG. 4 illustrates an example of a device formed by the first method, where the device is grown on a template that creates the c-axis orientation shown in FIG. 3. The device illustrated in FIG. 4 includes a GaN substrate 40, on which is grown an n-type region 41, a light emitting layer 20, and one or more p-type layers, including, for example, GaN cap layer 21, AlGaN layer 22, and contact layer 23. The device is finished by electrically connecting contacts to the n-type and p-type sides of light emitting layer 20. FIG. 9 illustrates a unit cell of wurtzite GaN, formed from gallium atoms 93 and nitrogen atoms 94. Wurtzite GaN has a gallium face 90 and a nitrogen face 91. The c-axis 92 points from the nitrogen face 91 to the gallium face 90. The exposed, top surface of GaN created by, for example, conventional growth on a c-plane sapphire substrate, is the gallium face 90. Growth on the gallium face 90 of a GaN surface results in the c-axis orientation illustrated in FIG. 2. The buried surface of GaN adjacent to the sapphire after conventional growth on c-plane sapphire is the nitrogen face 91. In the device of FIG. 4, the material and surface of substrate 40 are selected to promote growth of the nitrogen face 91 on the epitaxial surface. Examples of suitable substrates include: the nitrogen face of a GaN or AlN substrate; the nitrogen face of a thick GaN layer which was grown with Ga face polarity and removed from its growth substrate; the oxygen face of a ZnO substrate; the carbon face of a SiC substrate; and the surface of the GaN layer deposited on sapphire by MBE, where GaN is deposited directly on the sapphire without an intermediate buffer layer. Often, a thick high-quality GaN layer is grown by MBE on sapphire by first depositing an AlN buffer layer on the sapphire, followed by the GaN layer. This results in a film with the gallium-face 90 on the surface. By omitting the AlN buffer layer, the film will have the nitrogen-face 91 on the surface. Growth of gallium-face films is described in more detail in "Morphological and structure characteristics of homoepitaxial GaN grown by metalorganic chemical vapour deposition (MOCVD)," Journal of Crystal Growth 204 (1999) 419–428 and "Playing with Polarity", Phys. Stat. Sol. (b) 228, No. 2, 505–512 (2001), both of which are incorporated herein by reference.

Figure 5:
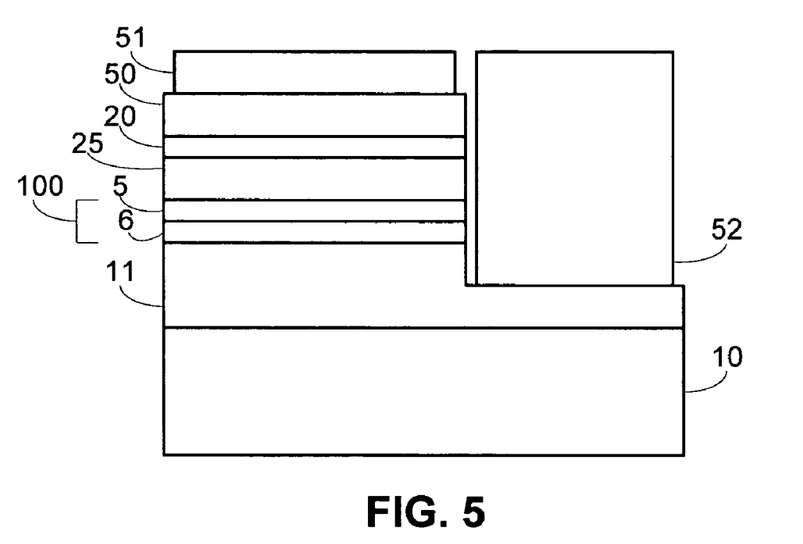
FIG. 5 illustrates a device incorporating a tunnel junction and a p-type region grown before the light emitting region.
Figure 7:
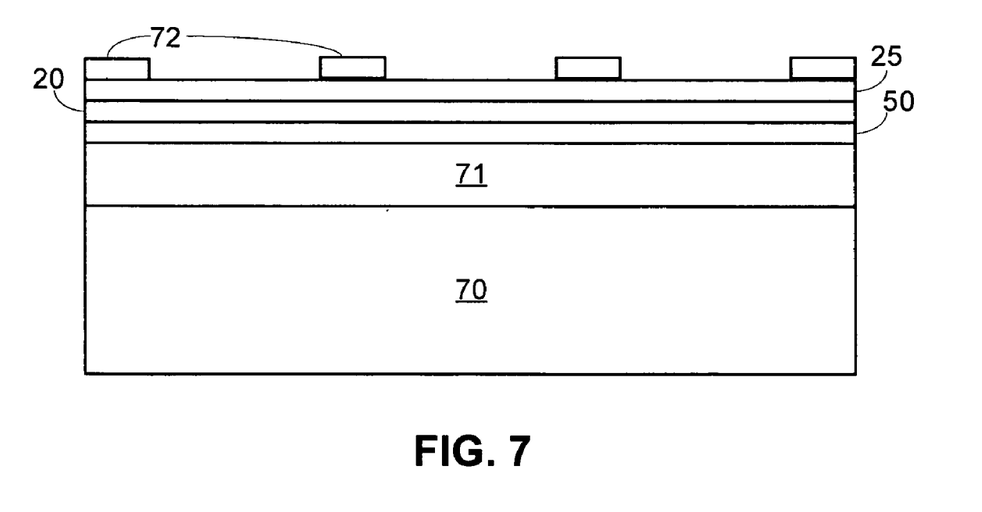
FIG. 7 illustrates the device of FIG. 6 after bonding to a host substrate and removal of the growth substrate.

FIGS. 5 and 7 illustrate examples of devices formed by the second method, where the p-type region is grown before the light emitting region, resulting in the desired reverse polarization c-axis orientation illustrated in FIG. 3.

FIG. 5 illustrates a device including a tunnel junction to provide a reversed polarization. In the device of FIG. 5, an n-type region 11 is formed on a conventional substrate 10, such as sapphire or SiC. A tunnel junction is formed over n-type region 11, followed by p-type region 25, which may include, for example, layers 21, 22, and 23 illustrated in FIG. 3. A light emitting region 20 is formed over p-type region 25, followed by another n-type region 50. Contacts 51 and 52 electrically connect to the opposite sides of the light emitting region, contact 51 to n-type region 50 and contact 52 to n-type region 11. Tunnel junction 100 allows for a conductivity change in the material grown above the tunnel junction as compared to the material below.

Tunnel junction 100 includes a heavily doped p-type layer 5, also referred to as a p++ layer, and a heavily doped n-type layer 6, also referred to as an n++ layer. P++ layer 5 may be, for example, InGaN or GaN for a blue-emitting device or AlInGaN or AlGaN for a UV-emitting device, doped with an acceptor such as Mg or Zn to a concentration of about $10^{18}$ cm$^{-3}$ to about $5\times10^{20}$ cm$^{-3}$. In some embodiments, p++ layer 5 is doped to a concentration of about $2\times10^{20}$ cm$^{-3}$ to about $4\times10°$ cm$^{-3}$. N++ layer 6 may be, for example, InGaN or GaN for a blue-emitting device or AlInGaN or AlGaN for a UV-emitting device, doped with a donor such as Si, Ge, Se, or Te to g a concentration of about $10^{18}$ cm$^{-3}$ to about $5\times10^{20}$ cm$^{-3}$. In some embodiments, n++ layer 6 is doped to a concentration of about $7\times10^{19}$ cm$^{-3}$ to about $9\times10^{19}$ cm$^{-3}$. Tunnel junction 100 is usually very thin, for example tunnel junction 100 may have a total thickness ranging from about 2 nm to about 100 nm, and each of p++ layer 5 and n++ layer 6 may have a thickness ranging from about 1 nm to about 50 nm. In some embodiments, each of p++ layer 5 and n++ layer 6 may have a thickness ranging from about 25 nm to about 35 nm. P++ layer 5 and n++ layer 6 may not necessarily be the same thickness. In one embodiment, p++ layer 5 is 15 nm of Mg-doped InGaN and n++ layer 6 is 30 nm of Si-doped GaN. P++ layer 5 and n++ layer 6 may have a graded dopant concentration. For example, a portion of p++ layer 5 adjacent to p-type region 25 may have a dopant concentration that is graded from the dopant concentration of the p-type region to the desired dopant concentration in p++ layer 5. Similarly, n++ layer 6 may have a dopant concentration that is graded from a maximum adjacent to p++ layer 5 to a minimum adjacent to n-type region 11. Tunnel junction 100 is fabricated to be thin enough and doped enough such that tunnel junction 100 is near ohmic when reverse-biased, i.e. tunnel junction 100 displays low series voltage drop and low resistance when conducting current in reverse-biased mode. In some embodiments, the voltage drop across tunnel junction 100 when reverse-biased is about 0.1V to about 1V at current densities of 200A/cm$^2$.

Tunnel junction 100 is fabricated such that when a voltage is applied across contacts 51 and 52 such that the p-n junction is forward biased, tunnel junction 100 quickly breaks down and conducts in the reverse-bias direction with a minimal voltage drop. Each of the layers in tunnel junction 100 need not have the same composition, thickness, or dopant composition. Tunnel junction 100 may also include an additional layer between p++ layer 5 and n++ layer 6 that contains both p- and n-type dopants.

In some embodiments, p-type region 25 may be formed directly on an n-type or undoped region grown on substrate 10, without a tunnel junction. Contact 52 must then be connected to p-type region 25, and the n-type or undoped region on substrate 10 is not electrically involved in operating the device. The use of a tunnel junction 100 as illustrated in FIG. 5 has the benefit of contact 52 being formed on an n-type region 11, which provides better current spreading than a p-type region.

Figure 6:
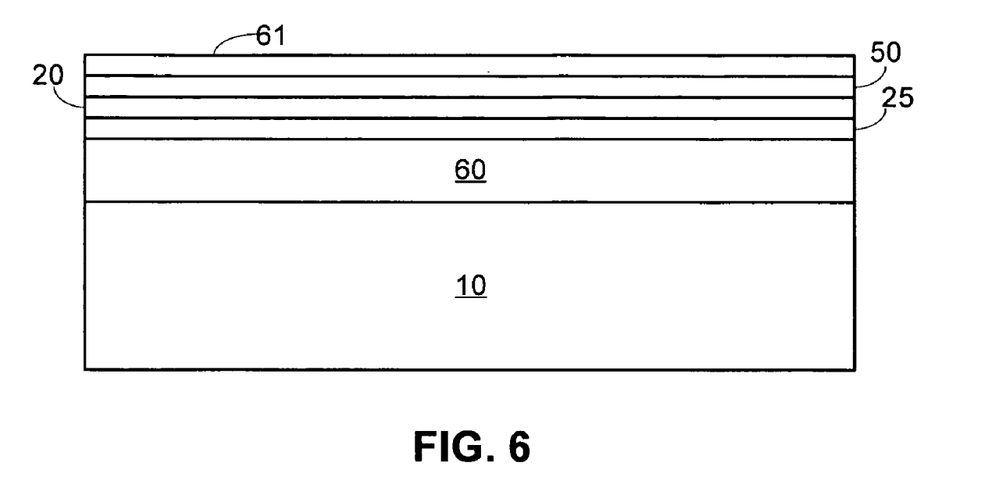
FIG. 6 illustrates a device with a p-type region grown before the light emitting region.

FIG. 7 illustrates another example of a device with the p-type region grown before the light emitting region, a device from which the conventional growth substrate has been removed. Such a device is formed by growing the device layers on a conventional growth substrate, bonding the device layers to a host substrate, then removing the growth substrate. FIG. 6 illustrates the device layers grown on a conventional growth substrate 10. A region 60, which is generally n-type or undoped, is grown over substrate 10. Region 60 may include optional preparation layers such as buffer layers or nucleation layers, and optional etch stop layers designed to facilitate release of the growth substrate or thinning of the epitaxial layers after substrate removal. P-type region 25 is grown over region 60, followed by light emitting layer 20, and n-type region 50. One or more metal layers 61, including, for example, ohmic contact layers, reflective layers, barrier layers, and bonding layers, are deposited over n-type region 50.

The device layers are then bonded to a host substrate 70, shown in FIG. 7, via the exposed surface of metal layers 61. One or more bonding layers 71, typically metal, may serve as compliant materials for thermo-compression or eutectic bonding between the epitaxial structure and the host substrate. Examples of suitable bonding layer metals include gold and silver. Host substrate 70 provides mechanical support to the epitaxial layers after the growth substrate is removed, and provides electrical contact to n-type region 50. Host substrate 70 is generally selected to be electrically conductive (i.e. less than about 0.1 Ωcm), to be thermally conductive, to have a coefficient of thermal expansion (CTE) matched to that of the epitaxial layers, and to be flat (i.e. with an root mean square roughness less than about 10 nm) enough to form a strong wafer bond. Suitable materials include, for example, metals such as Cu, Mo, Cu/Mo, and Cu/W; semiconductors with metal contacts, such as Si with ohmic contacts and GaAs with ohmic contacts including, for example, one or more of Pd, Ge, Ti, Au, Ni, Ag; and ceramics such as AlN or compressed diamond.

Host substrate 70 and epitaxial layers 25, 20, and 50 are pressed together at elevated temperature and pressure to form a durable metal bond between bonding layers, shown at 71 in FIG. 7. In some embodiments, bonding is done on a wafer scale, before a wafer with an epitaxial structure is diced into individual devices. The temperature and pressure ranges for bonding are limited on the lower end by the strength of the resulting bond, and on the higher end by the stability of the host substrate structure and the epitaxial structure. For example, high temperatures and/or high pressures can cause decomposition of the epitaxial layers, delamination of metal contacts, failure of diffusion barriers, or outgassing of the component materials in the epitaxial layers. A suitable temperature range is, for example, about 200° C. to about 500° C. A suitable pressure range is, for example, about 100 psi to about 300 psi.

In order to remove a sapphire growth substrate, portions of the interface between substrate 10 and crystal layers 60, 25, 20, and 50 are exposed, through substrate 10, to a high fluence pulsed ultraviolet laser in a step and repeat pattern.

The photon energy of the laser is above the band gap of the crystal layer adjacent to the sapphire (GaN in some embodiments), thus the pulse energy is effectively converted to thermal energy within the first 100 nm of epitaxial material adjacent to the sapphire. At sufficiently high fluence (i.e. greater than about 1.5 J/cm$^2$) and a photon energy above the band gap of GaN and below the absorption edge of sapphire (i.e. between about 3.44 and about 6 eV), the temperature within the first 100 nm rises on a nanosecond scale to a temperature greater than 1000° C., high enough for the GaN to dissociate into gallium and nitrogen gasses, releasing the epitaxial layers from substrate 10. The resulting structure includes epitaxial layers 60, 25, 20, and 50 bonded to host substrate 70. In some embodiments, the growth substrate may be removed by other means, such as etching, lapping, or a combination thereof After the growth substrate is removed, the remaining epitaxial layers may be thinned, for example to remove low quality region 60 to expose p-type region 25. The epitaxial layers may be thinned by, for example, chemical mechanical polishing, conventional dry etching, or photoelectrochemical etching (PEC). A contact 72 is then formed on p-type region 20. Contact 72 may be, for example, a grid as illustrated in cross section in FIG. 7.

Figure 8:
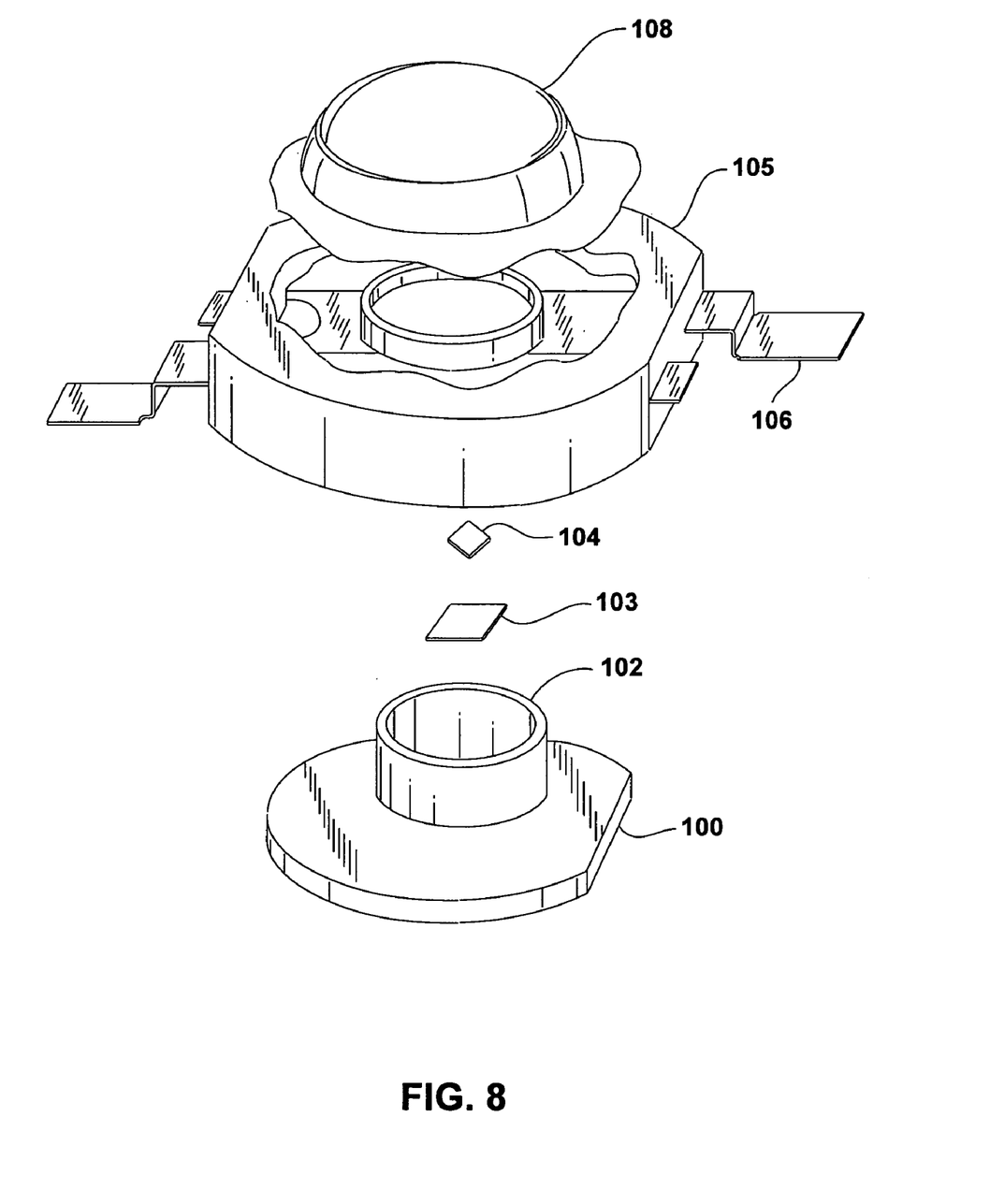
FIG. 8 is an exploded view of a packaged light emitting device.

FIG. 8 is an exploded view of a packaged light emitting device. A heat-sinking slug 100 is placed into an insert-molded leadframe. The insert-molded leadframe is, for example, a filled plastic material 105 molded around a metal frame 106 that provides an electrical path. Slug 100 may include an optional reflector cup 102. The light emitting device die 104, which may be any of the devices described above, is mounted directly or indirectly via a thermally conducting submount 103 to slug 100. A cover 108, which may be an optical lens, may be added.

Having described the invention in detail, those skilled in the art will appreciate that, given the present disclosure, modifications may be made to the invention without departing from the spirit of the inventive concept described herein. For example, though the embodiments described herein include InGaN light emitting layers, the same structures and techniques may be used in devices with AlGaN, GaN, or AlInGaN light emitting layers. Therefore, it is not intended that the scope of the invention be limited to the specific embodiments illustrated and described.

What is being claimed is:

1. A structure comprising:
    a semiconductor light emitting layer disposed between a p-type region and an n-type region, wherein:
        the light emitting layer comprises a wurtzite crystal structure;
        the light emitting layer has a thickness of at least 50 angstroms; and
        across an interface disposed between the light emitting layer and the p-type region, a wurtzite c-axis, defined as pointing from a nitrogen face of a III-nitride unit cell to a gallium face of a III-nitride unit cell, points toward the light emitting layer.
2. The structure of claim 1 wherein the light emitting layer has a thickness between 50 and 500 angstroms.
3. The structure of claim 1 wherein the light emitting layer has a thickness between 60 and 300 angstroms.
4. The structure of claim 1 wherein the light emitting layer has a thickness between 75 and 175 angstroms.
5. The structure of claim 1 wherein the light emitting layer has a thickness greater than 100 angstroms.
6. The structure of claim 1 wherein the light emitting layer is a III-nitride layer.
7. The structure of claim 1 wherein the light emitting layer is InGaN.
8. The structure of claim 1 wherein the light emitting layer is AlGaN.
9. The structure of claim 1 wherein the light emitting layer has a dislocation density less than $10^9/cm^2$.
10. The structure of claim 1 wherein the light emitting layer has a dislocation density less than $10^8/cm^2$.
11. The structure of claim 1 wherein the light emitting layer has a dislocation density less than $10^7/cm^2$.
12. The structure of claim 1 wherein the light emitting layer has a dislocation density less than $10^6/cm^2$.
13. The structure of claim 1 further comprising a GaN substrate, wherein the n-type region is disposed between the GaN substrate and the light emitting layer.
14. The structure of claim 13 wherein across an interface disposed between the GaN substrate and the n-type region, a wurtzite crystal c-axis points toward the GaN substrate.
15. The structure of claim 1 wherein the n-type region is a first n-type region, the structure further comprising a tunnel junction and a second n-type region, wherein the tunnel junction is disposed between the second n-type region and the p-type region.
16. The structure of claim 15 wherein the p-type region is grown before the light emitting layer.
17. The structure of claim 1 wherein the light emitting layer, p-type region, and n-type region are bonded to a host substrate by a bond disposed proximate the n-type region.
18. The structure of claim 1 further comprising a first lead electrically connected to the n-type region, a second lead electrically connected to the p-type region, and a cover disposed over the light emitting layer.
19. A structure comprising:
    a semiconductor light emitting layer;
    an n-type region;
    a p-type region, the p-type region comprising a barrier layer having a band gap greater than a band gap in the light emitting layer, such that an edge of the barrier layer forms a barrier to charge carriers in the light emitting layer; and
    a negative polarization-induced charge at the barrier; wherein:
    the light emitting layer is disposed between the n-type region and the p-type region; and
    the light emitting layer has a thickness of at least 50 angstroms.
20. The structure of claim 19 wherein the light emitting layer has a thickness between 50 and 500 angstroms.
21. The structure of claim 19 wherein the light emitting layer has a thickness between 60 and 175 angstroms.
22. The structure of claim 19 wherein the light emitting layer is a III-nitride layer.
23. The structure of claim 19 further comprising a first lead electrically connected to the n-type region, a second lead electrically connected to the p-type region, and a cover disposed over the light emitting layer.
24. The structure of claim 19 wherein the barrier layer is n-type or undoped and the barrier comprises an interface between the barrier layer and a p-type layer in the p-type region.

* * * * *